United States Patent
Jang et al.

(10) Patent No.: US 6,689,665 B1
(45) Date of Patent: Feb. 10, 2004

(54) METHOD OF FORMING AN STI FEATURE WHILE AVOIDING OR REDUCING DIVOT FORMATION

(75) Inventors: Syun-Ming Jang, Hsin-Chu (TW); Mo-Chiun Yu, Taipei (TW)

(73) Assignee: Taiwan Semiconductor Manufacturing, Co., Ltd, Hsin Chu (TW)

( * ) Notice: Subject to any disclaimer, the term of this patent is extended or adjusted under 35 U.S.C. 154(b) by 0 days.

(21) Appl. No.: 10/269,309

(22) Filed: Oct. 11, 2002

(51) Int. Cl.$^7$ .............................. H01L 21/336
(52) U.S. Cl. .................. 438/296; 438/424; 438/433; 438/435; 438/738; 438/744; 438/950; 257/506; 257/509; 257/510; 257/513; 257/635; 257/640; 257/647
(58) Field of Search ................. 438/296, 433, 438/424, 435, 738, 744, 950, 952; 257/506, 510, 509, 513, 636, 640, 647, 649

(56) References Cited

U.S. PATENT DOCUMENTS 6,255,717 B1 * 7/2001 Babcock et al. ............ 257/640
6,355,540 B2 * 3/2002 Wu .............................. 438/433

* cited by examiner

Primary Examiner—David Nelms
Assistant Examiner—Reneé R. Berry
(74) Attorney, Agent, or Firm—Tung & Associates

(57) ABSTRACT

A method for forming shallow trench isolation (STI) features to reduce or avoid divot formation at STI trench corners including providing a shallow trench isolation (STI) feature included in a semiconductor process surface the STI feature including an anisotropically etched trench formed into a semiconductor substrate extending through a thickness including a thermally grown silicon dioxide layer overlying the semiconductor substrate and a metal nitride hardmask layer overlying the thermally grown silicon dioxide layer said anisotropically etched trench being back filled with a silicon dioxide filling material; removing excess silicon dioxide filling material overlying the hardmask layer according to a chemical mechanical polishing (CMP) process; removing the hard mask layer according to a wet chemical etching process; and, re-growing the thermally grown silicon dioxide layer including re-oxidizing to at least an originally formed thermally grown silicon dioxide layer thickness.

20 Claims, 3 Drawing Sheets

METHOD OF FORMING AN STI FEATURE WHILE AVOIDING OR REDUCING DIVOT FORMATION

FIELD OF THE INVENTION

This invention generally relates to semiconductor processing methods and more particularly to a method for forming shallow trench isolation structures while avoiding or reducing divot formation at STI trench corners.

BACKGROUND OF THE INVENTION

In the integrated circuit industry today, hundreds of thousands of semiconductor devices are built on a single chip. Every device on the chip must be electrically isolated to ensure that it operates independently without interfering with another. The art of isolating semiconductor devices has become an important aspect of modern metal-oxide-semiconductor (MOS) and bipolar integrated circuit technology for the separation of different devices or different functional regions. With the high integration of the semiconductor devices, improper electrical isolation among devices will cause current leakage, and the current leakage can consume a significant amount of power as well as compromise functionality. Among some examples of reduced functionality include latch-up, which can damage the circuit temporarily, or permanently, noise margin degradation, voltage shift and cross-talk.

Shallow trench isolation (STI), is a preferred electrical isolation technique especially for a semiconductor chip with high integration. STI structures can be made using a variety of methods including, for example, the Buried Oxide (BOX) isolation method for shallow trenches. The BOX method involves filling the trenches with a chemical vapor deposition (CVD) silicon oxide ($SiO_2$) which is then planarized by a plasma etched back process and/or a chemical mechanical polishing (CMP) process to yield a planar surface. The shallow trenches etched for the BOX process are anisotropically plasma etched into the substrate, for example, silicon, and are typically between about 0.3 and about 1.0 microns deep.

Shallow trench isolation features with trenches having submicrometer dimensions are effective in preventing latch-up and punch-through phenomena. Broadly speaking, conventional methods of producing a shallow trench isolation feature include: forming a hard mask, for example silicon nitride, over the targeted trench layer, for example including a thermally grown pad oxide layer, patterning a photoresist over the hard mask to define a trench feature, anisotropically etching the hard mask to form a patterned hard mask, and thereafter anisotropically etching the trench feature to form the shallow trench isolation feature. Subsequently, the photoresist is removed (e.g., stripped) and the shallow trench isolation feature is back-filled, with a dielectric material, for example a CVD silicon dioxide, also referred to as STI oxide, followed by thermal treatment and planarization steps to remove excess materials remaining above the trench level.

In the STI technique, the shallow trench isolation area is first defined to form STI trenches anisotropically etched into the silicon substrate through overlying layers including a pad oxide layer and a hardmask metal nitride layer, for example silicon nitride, overlying the pad oxide layer. The STI trench is then lined with for example, a thermally grown silicon dioxide layer, also referred to as an oxide trench liner, grown over the exposed silicon substrate forming the trench surfaces. The STI trench is then back filled with a chemical vapor deposited (CVD) oxide and chemically mechanically polished (CMP) back to the hardmask layer also functioning as a CMP polish stop layer to form a planar surface. The hardmask layer is then removed according to a first acidic wet etching procedure followed by a second acidic wet etching procedure to remove the pad oxide layer.

One problem with the prior art STI feature formation process is that during the acidic wet etching processes to remove the hardmask layer and the pad oxide layer, unintentional over etching of the hardmask layer and/or the pad oxide layer frequently occurs leading to divot formation, for example, at the STI trench corners, where the oxide material, for example, the trench oxide liner, is susceptible to etching by, for example, hydrofluoric (HF) acid used to remove the pad oxide layer. The formation of such etching defects adversely affects the electrical integrity of semiconductor devices in a number of ways such as, example, altering the threshold voltage of a field effect transistor (FET), altering the device off-state current, and making the device susceptible to reverse short channel effects.

For example, referring to FIGS. 1A–1E are shown cross-sectional side views of formation of typical trench isolation structures at stages in an STI manufacturing process. Referring to FIG. 1A are shown STI trenches 12A and 12B formed by an anisotropic etching process etching through silicon nitride layer 14B and thermally grown pad oxide layer 14A grown over silicon substrate 12 and about 3000 to about 5000 Angstroms into the silicon substrate 12. Referring to FIG. 1B, STI trenches 12A and 12B have a thermally grown oxide liner 16 formed over the sidewall and bottom portions of the STI trench over the exposed silicon substrate by a high temperature annealing process in an oxygen containing ambient carried out at about 800° C. to about 1150° C.

Referring to FIG. 1C, the STI trenches 12A and 12B are subsequently back-filled with a silicon dioxide fill material, for example, by a high density plasma (HDP-CVD) process to form STI oxide layer 18 (oxide liner 16 not shown). Referring to FIG. 1D, a CMP process is carried out to polish back the excess STI oxide layer 18 overlying the silicon nitride layer 14B, the silicon nitride layer 14B, also acting as a polishing stop. Referring to FIG. 1E, a hot phosphoric acid ($H_3PO_4$) wet etchant solution, for example at about 150° C. is used to remove silicon nitride layer 14B and a hydrofluoric acid (HF) wet etchant solution is then used to remove the pad oxide layer 14A. During the pad oxide wet etching process, over etching, particularly at the STI trench corners can occur forming divots (e.g., 12C, 12D) at the STI trench corners extending into the STI back filled trenches due to preferential over etching of the oxide trench liner 16 during the hydrofluoric acid (HF) wet etching process to remove the pad oxide. The trench corners are particularly susceptible to divot formation by preferential etching during the HF etching process. As a result, electrical performance shortcomings in a semiconductor device are experienced including what is known in the art as off-state current and reverse short channel effects caused by high electric fields at the trench corners.

There is therefore a need in the semiconductor processing art to develop a method of forming shallow trench isolation features that will reduce or avoid the problem of divot formation at the STI trench corners thereby overcoming electrical performance shortcomings is a completed semiconductor device.

It is therefore an object of the invention to provide a method of forming shallow trench isolation features that will reduce or avoid the problem of divot formation at the STI trench corners thereby overcoming electrical performance shortcomings is a completed semiconductor device while overcoming other shortcomings of the prior art.

SUMMARY OF THE INVENTION

To achieve the foregoing and other objects, and in accordance with the purposes of the present invention, as embodied and broadly described herein, the present invention provides a method for forming shallow trench isolation (STI) features to reduce or avoid divot formation at STI trench corners.

In a first embodiment, the method includes providing a shallow trench isolation (STI) feature included in a semiconductor process surface the STI feature including an anisotropically etched trench formed into a semiconductor substrate extending through a thickness including a thermally grown silicon dioxide layer overlying the semiconductor substrate and a metal nitride hardmask layer overlying the thermally grown silicon dioxide layer said anisotropically etched trench being back filled with a silicon dioxide filling material; removing excess silicon dioxide filling material overlying the hardmask layer according to a chemical mechanical polishing (CMP) process; removing the hard mask layer according to a wet chemical etching process; and re-growing the thermally grown silicon dioxide layer including re-oxidizing to at least an originally formed thermally grown silicon dioxide layer thickness.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

The method of the present invention is explained with respect to processing steps included in forming a shallow trench isolation (STI) structure. It will be appreciated that although direct benefits will be realized according to the method of the present invention by avoiding the formation of divots at STI trench corners, that other indirect benefits will additionally be realized including the improved electrical performance reliability of the semiconductor device including associated subsequent steps such as gate oxide formation, increased gate oxide integrity and reduced junction leakage current. The term 'active areas' as used herein refers to areas of the semiconductor process surface where electrically active areas are formed for operating a completed semiconductor device.

In one embodiment of the invention, a shallow trench isolation feature is provided by forming an anisotropically etched opening through a thickness of an overlying hard mask layer overlying a pad oxide layer to include a thickness portion of a semiconductor substrate. The shallow trench isolation feature is then back filled with an STI oxide and subjected to a CMP process to remove the hardmask layer. Subsequently the pad oxide underlying the hardmask is thermally re-oxidized including re-grown prior to subsequent CMOS manufacturing processes including well and voltage threshold ion implant processes.

Figure 1A:
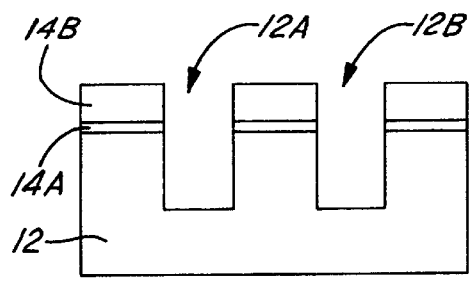
FIGS. 1A–1E are cross sectional side views of a portion of a shallow trench isolation region showing manufacturing stages of shallow trench isolation features formed according to the prior art.
Figure 1B:
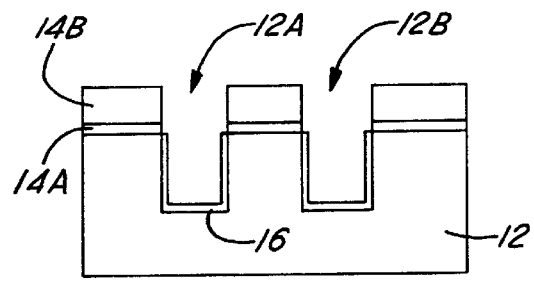
Figure 1C:
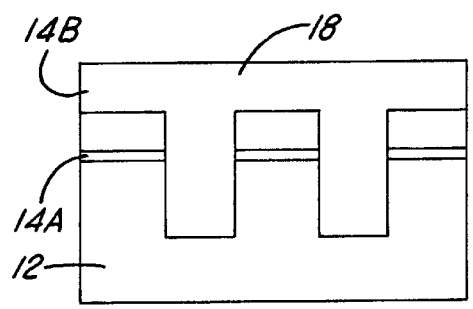
Figure 1D:
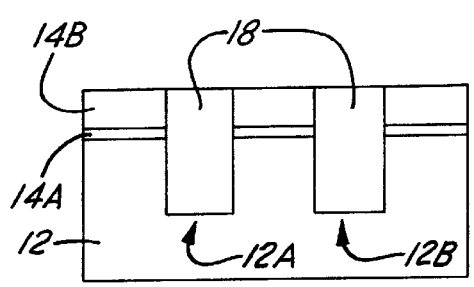
Figure 1E:
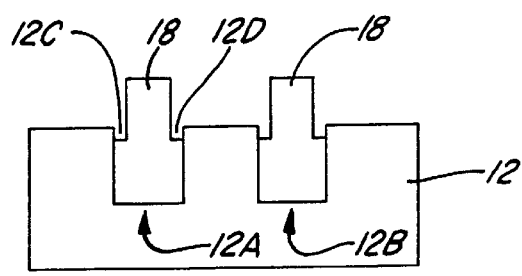
Figure 2A:
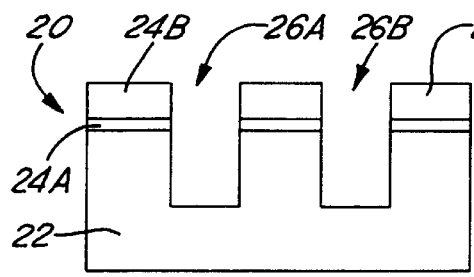
FIGS. 2A–2F are conceptual cross sectional views of a portion of a shallow trench isolation region showing manufacturing stages of shallow trench isolation features formed according to embodiments of the present invention.

For example, referring to FIGS. 2A–2F is shown an exemplary embodiment including cross sectional side view representations of STI feature formation at stages in an STI manufacturing processes according to the present invention. Referring to FIG. 2A, a trench isolation region 20, having a substrate 22, for example, a single crystalline silicon semiconductor wafer having a thermally grown pad oxide 24A formed over the process surface. The pad oxide layer 24A is preferably formed of silicon dioxide grown by a conventional thermal oxidation process to a thickness of between about 50 Angstroms and about 300 Angstroms. For example, the pad oxide layer 24A is grown in rapid thermal oxidation process (RTO) or in a conventional annealing process including oxygen at a temperature of about 800° C. to about 1150° C.

Formed over the pad oxide layer 24A is a metal nitride hardmask layer 24B, for example silicon nitride or silicon oxynitride. For example, the hardmask layer 24B is deposited according to a CVD process, for example, a low pressure CVD (LPCVD) process. Preferably the metal nitride hard mask layer 24B is formed to have a thickness of between about 200 Angstroms and 2,000 Angstroms.

Figure 2B:
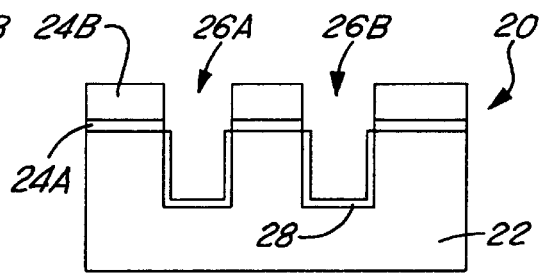

Still referring to FIG. 2B, following formation of the hardmask layer 24B, the hardmask layer 24B is photolithographically patterned (not shown) by a conventional method to anisotropically etching STI trenches e.g., 26A, 26B around active areas of the semiconductor device. For example, a conventional reactive ion etching (RIE) process is used to anisotropically etch through the hardmask layer 24B, the pad oxide layer 24A, and through a portion of a thickness of the semiconductor substrate 22, for example silicon, to form trench openings having a depth of for example, between about 1,500 Angstroms and 5000 Angstroms. Subsequently, the photoresist (not shown) is removed according to a conventional plasma ashing process. Preferably, the STI trench features are etched having sloped trench sidewalls, for example having an angle between about 70° and 90° (not shown) with top and bottom rounded corners, (not shown) to minimize stress.

Referring to FIG. 2B, following formation of the STI trenches, 26A, 26B, a silicon dioxide trench liner e.g., 28 is thermally grown over the silicon substrate 20 by a conventional thermal oxidation technique to form a conformally grown silicon dioxide layer over the silicon substrate of from about 50 to about 200 Angstroms in thickness. A conventional thermal oxidation process, for example, in a dry or wet oxygen containing ambient at a temperature of about 800–1150° C. is a suitable method to grow silicon dioxide layer 28 on the silicon substrate 22. The oxide trench liner 28 serves to relieve stress and repair etching damage to the silicon substrate. Optionally, a thin layer of silicon nitride or silicon oxynitride, for example 50 to 100 Angstroms may be deposited over the oxide trench liner to form a double trench liner (not shown) prior to backfilling the trench with silicon dioxide filling material. The silicon nitride serves to relieve stresses induced in the oxide trench liner.

Figure 2C:
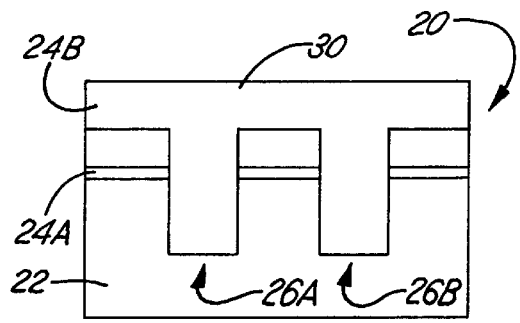

Referring to FIG. 2C, following formation of the oxide trench liner 28 a CVD process including, for example, one of a PECVD and HDP-CVD process is carried out to form silicon oxide layer 30, for example, silicon dioxide, also referred to as an STI oxide or HDP oxide, to fill the STI trenches 26A, 26B (oxide trench liner not shown) including covering the silicon nitride layer 24. For example, the STI oxide is deposited to a thickness of between about 3000 and about 7000 Angstroms. Following deposition of the STI oxide layer 30, a conventional annealing process, for example a conventional rapid thermal annealing (RTA) process is optionally carried out, for example at temperatures from about 800–1150° C. to improve the oxide quality.

Figure 2D:
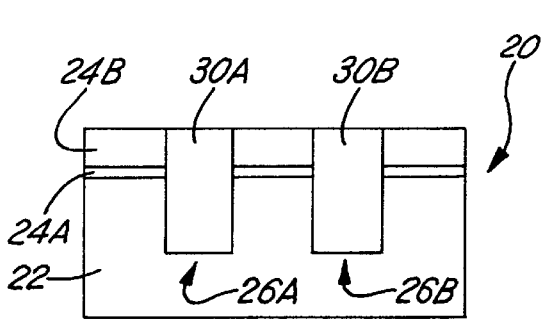

Referring to FIG. 2D, a CMP process is carried out to remove the STI oxide layer 30 overlying the hardmask layer 24B to define backfilled STI oxide portion e.g., 30A and 30B filling respectively STI trenches 26A and 26B. The hardmask layer also serves as a CMP polish stop where the CMP process is stopped on the hardmask layer 24B. Optionally, a reverse mask etch process as is known in the art is first carried out to remove a portion of the STI oxide layer 30 overlying an active area (not shown) of the semiconductor device prior to the CMP process to reduce the CMP polishing time and to improve the CMP results.

Figure 2E:
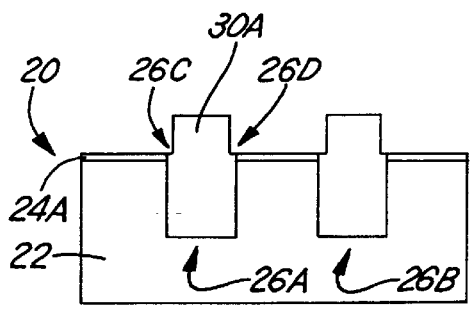

Referring to FIG. 2E, following the CMP process the hardmask layer 24B is removed by a conventional wet chemical etching process, for example, by dipping the semiconductor process wafer in hot phosphoric acid $H_3PO_4$ maintained at about 150° C.

According to an embodiment of the method of the present invention, the pad oxide layer 24A is not removed in a wet etching process using for example HF in contrast with the prior art. Although a portion of the pad oxide layer 24A and STI oxide e.g., 30A and 30B within the trenches 26A and 26B are removed by the hot phosphoric acid wet etching process to remove the hardmask layer, according to the present invention, the formation of divots or over etching at the STI trench corners, e.g., 26C and 26D is reduced by not removing the pad oxide layer in an acidic wet etching process.

Figure 2F:
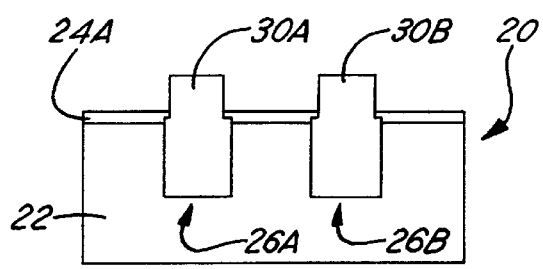

Referring to FIG. 2F, according to another embodiment of the present invention, the pad oxide layer 24A is subjected to a re-oxidation process including re-growing the pad oxide layer following the hot phosphoric acid etching process thereby replacing etched portions of the pad oxide layer and producing a more uniform oxide layer. Preferably, the STI region 20 including the STI features formed on a semiconductor wafer process surface is subjected to an elevated temperature including an oxygen containing ambient to re-oxidize the pad oxide 24A preferably forming a pad oxide layer 24A having a thickness of from about 200 to about 1000 Angstroms. Preferably, the re-oxidized pad oxide layer 24A substitutes for a sacrificial oxide layer (not shown) subsequently formed in the prior art processes to modify ion implant depths in a subsequent ion implanting process for example, including n and p well formation and voltage threshold adjustment implants. For example, the re-oxidation process can be carried out in a conventional batch furnace or rapid thermal oxidation process carried out at temperatures from about 800° C. to about 1150° C.

Figure 3:
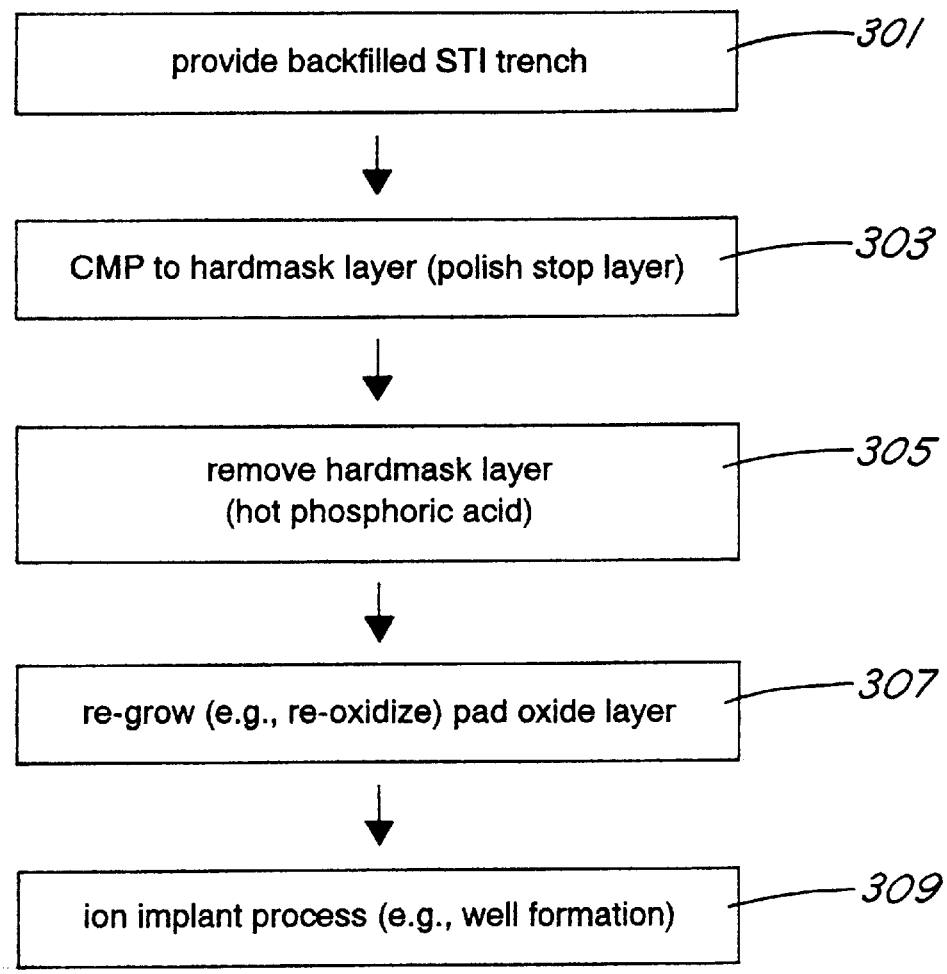
FIG. 3 is a process flow diagram including several embodiments of the present invention for forming an STI feature.

Referring to FIG. 3 is a process flow diagram including several embodiments of the present invention for forming a shallow trench isolation feature. Included in process 301 are conventional processes for forming a back filled STI trench including (1) providing an anisotropically etched feature into a semiconductor substrate including an overlying thermally grown silicon dioxide layer and a metal nitride hardmask layer (2) backfilling the anisotropically etched feature with silicon dioxide fill material. In process 303, excess silicon dioxide fill material is removed according to a CMP process stopping at the hardmask layer.

According to the present invention, in process 305, the hardmask layer is removed according to a hot phosphoric acid wet etching process including apportion of the thermally grown silicon dioxide layer (pad oxide layer). In process 307, according to the present invention, the thermally grown silicon dioxide layer (pad oxide layer) is subjected to an annealing process in an oxygen containing ambient to re-grow including re-oxidizing the thermally grown silicon dioxide layer (pad oxide layer). In process 309, subsequent CMOS manufacturing steps including ion implantation steps are carried out whereby the re-oxidized pad oxide layer serves to modify an ion implant profile in place of a sacrificial oxide layer formed according to the prior art.

In contrast with the prior art, the thermally grown silicon dioxide layer (pad oxide layer) is not completely removed in the method of the present invention thereby avoiding the formation of divots at top trench corners. Advantageously, by re-oxidizing the thermally grown silicon dioxide layer (pad oxide layer), any damage caused by the wet etching step to remove the hard mask layer is repaired thereby avoiding electrical performance problems including band to band tunneling associated with high field regions in the silicon (trench corners with divots). In addition, by not removing the pad oxide layer according to a wet etching process of the prior art, subsequent steps requiring silicon substrate cleaning and growth of a sacrificial oxide layer over the silicon substrate to modify the ion implanting processes for n and p well formation as well as threshold voltage adjustment, are avoided thereby saving processing costs and increasing throughput. In addition, a number of electrical performance benefits in a completed semiconductor device are realized including 1) reduced transistor off current and reduced reverse short channel effects, 2) reduced gate oxide integrity degradation, 3) reducing poly-silicon residues following gate patterning, and 4) reducing junction leakage current.

Thus, there has been presented a method of forming shallow trench isolation features that will reduce or avoid the problem of divot formation at the STI trench corners thereby overcoming electrical performance shortcomings in a completed semiconductor device while overcoming other shortcomings of the prior art.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming shallow trench isolation (STI) features to reduce or avoid divot formation at STI trench corners comprising the steps of:

providing a shallow trench isolation (STI) feature included in a semiconductor process surface the STI feature comprising an etched trench formed into a semiconductor substrate extending through a thickness;

said thickness comprising a thermally grown first silicon dioxide layer overlying the semiconductor substrate and a metal nitride hardmask layer overlying the first silicon dioxide layer;

thermally growing a second silicon dioxide layer to line the etched trench to form a trench liner;

filling said etched trench with a silicon dioxide filling material;

removing excess silicon dioxide filling material overlying the hardmask layer according to a chemical mechanical polishing (CMP) process to stop on the hardmask layer;

removing the hardmask layer according to a wet chemical etching process to leave a thickness portion of the first silicon dioxide layer; and, re-growing the first silicon dioxide layer to at least an originally formed first silicon dioxide layer thickness.

2. The method of claim 1, wherein the hardmask layer is selected from the group consisting of silicon nitride and silicon oxynitride.

3. The method of claim 1, further comprising the step of depositing a layer of one of silicon nitride and silicon oxynitride over the trench liner to form a double trench liner following the step of thermally growing a second silicon dioxide layer.

4. The method of claim 1, wherein the wet chemical etching process comprises a phosphoric acid ($H_3PO_4$) containing solution at a temperature of about 125° C. to about 175° C.

5. The method of claim 1, wherein the step of re-growing the first silicon dioxide layer comprises a thermal annealing process including an oxygen containing ambient at a temperature of about 800° C. to about 1150° C.

6. The method of claim 1, wherein the step of re-growing the first silicon dioxide layer comprises forming the first silicon dioxide layer to have a thickness of from about 50 Angstroms to about 300 Angstroms.

7. The method of claim 1, wherein the semiconductor substrate comprises a single crystalline silicon wafer.

8. The method of claim 1, further comprising the steps of subjecting the semiconductor process surface to an ion implantation process comprising at least one of well implant and a voltage threshold implant whereby the first thermally grown silicon dioxide layer modifies an ion implanting profile.

9. The method of claim 1, wherein the silicon dioxide filling material is deposited according to one of a plasma enhanced and high density plasma chemical vapor deposition process.

10. A method for forming a shallow trench isolation (STI) feature to avoid wet etching damage to the STI feature comprising the steps of:

providing an STI feature on a semiconductor process surface comprising an STI trench etched into a silicon substrate through an overlying pad oxide layer and a metal nitride hardmask layer overlying the pad oxide layer said STI trench back filled with a silicon dioxide filling material;

removing excess silicon dioxide filling material overlying the hardmask layer according to a chemical mechanical polishing (CMP) process to stop on the hardmask layer;

removing the hardmask layer according to a wet chemical etching process including a portion of the thermally grown silicon dioxide layer;

growing the overlying pad oxide layer to at least an originally formed pad oxide thickness; and, subjecting the semiconductor process surface to an ion implantation process comprising at least one of a well implant and a voltage threshold implant whereby the pad oxide layer modifies an ion implanting profile.

11. The method of claim 10, wherein the hardmask layer comprises at least one of silicon nitride and silicon oxynitride.

12. The method of claim 10, wherein the step of providing an STI feature comprises providing at least one trench liner selected from the group consisting of silicon dioxide, silicon nitride, and silicon oxynitride adjacent to the silicon substrate within the STI trench.

13. The method of claim 10, wherein the wet chemical etching process comprises a solution of phosphoric acid ($H_3PO_4$) at a temperature of about 125° C. to about 175° C.

14. The method of claim 10, wherein the step of growing the overlying pad oxide layer comprises a thermal annealing process at a temperature of about 800° C. to about 1150° C. including an oxygen containing ambient.

15. The method of claim 10, wherein the step of growing the overlying pad oxide layer comprises forming the pad oxide layer having a thickness of from about 50 Angstroms to about 300 Angstroms.

16. The method of claim 10, wherein the silicon dioxide filling material is back filled according to one of a plasma enhanced and high density plasma chemical vapor deposition (CVD) process.

17. The method of claim 1, wherein the etched trench is provided having sloped sidewalls between about 70 degrees and about 90 degrees.

18. The method of claim 1, wherein the etched trench comprises at least one of rounded top and bottom trench corners.

19. The method of claim 10, wherein the etched trench is provided having sloped sidewalls between about 70 degrees and about 90 degrees.

20. The method of claim 10, wherein the etched trench comprises at least one of rounded top and bottom trench corners.

* * * * *